US005838927A

United States Patent [19]
Gillon et al.

[11] Patent Number: 5,838,927
[45] Date of Patent: Nov. 17, 1998

[54] METHOD AND APPARATUS FOR COMPRESSING A CONTINUOUS, INDISTINCT DATA STREAM

[75] Inventors: William G. Gillon, Daly City; Andrew McFadden, Cupertino, both of Calif.

[73] Assignee: WebTV Networks, Mountain View, Calif.

[21] Appl. No.: 754,164

[22] Filed: Nov. 22, 1996

[51] Int. Cl.[6] .............................. G06F 13/38; G06F 15/17
[52] U.S. Cl. .................. 395/200.77; 395/200.61
[58] Field of Search .................. 395/200.33, 200.77, 395/200.61, 200.66; 341/51, 60; 370/476

[56] References Cited

U.S. PATENT DOCUMENTS

| | | | |
|---|---|---|---|
| 4,852,151 | 7/1989 | Dittakavi et al. | 379/97 |
| 4,922,523 | 5/1990 | Hashimoto | 379/96 |
| 4,975,944 | 12/1990 | Cho | 379/209 |
| 4,995,074 | 2/1991 | Goldman et al. | 379/97 |
| 5,005,011 | 4/1991 | Perlman et al. | 340/728 |
| 5,095,494 | 3/1992 | Takahashi et al. | 375/10 |
| 5,177,480 | 1/1993 | Clark | 341/51 |
| 5,241,587 | 8/1993 | Horton et al. | 379/92 |
| 5,263,084 | 11/1993 | Chaput et al. | 379/215 |
| 5,287,401 | 2/1994 | Lin | 379/98 |
| 5,299,307 | 3/1994 | Young | 395/161 |
| 5,325,423 | 6/1994 | Lewis | 379/90 |
| 5,341,293 | 8/1994 | Vertelney et al. | 364/419.17 |
| 5,369,688 | 11/1994 | Tsukamoto et al. | 379/100 |
| 5,410,541 | 4/1995 | Hotto | 370/76 |
| 5,425,092 | 6/1995 | Quirk | 379/215 |
| 5,454,079 | 9/1995 | Roper et al. | 395/200 |
| 5,469,540 | 11/1995 | Powers, III et al. | 395/158 |
| 5,488,411 | 1/1996 | Lewis | 348/8 |
| 5,490,208 | 2/1996 | Remillard | 379/96 |
| 5,521,597 | 5/1996 | Dimitri | 341/51 |
| 5,530,852 | 6/1996 | Meske, Jr. et al. | 395/600 |
| 5,538,255 | 7/1996 | Barker | 463/41 |
| 5,548,532 | 8/1996 | Menand et al. | 364/514 |
| 5,558,339 | 9/1996 | Perlman | 463/42 |
| 5,561,709 | 10/1996 | Remillard | 379/96 |
| 5,564,001 | 10/1996 | Lewis | 395/154 |
| 5,572,206 | 11/1996 | Miller et al. | 341/51 |
| 5,586,257 | 12/1996 | Perlman | 463/42 |
| 5,612,730 | 3/1997 | Lewis | 348/8 |
| 5,673,209 | 9/1997 | Heiney et al. | 364/715.02 |
| 5,675,507 | 10/1997 | Bobo, II | 364/514 |
| 5,686,912 | 11/1997 | Clark, II et al. | 341/51 |

OTHER PUBLICATIONS

"Four Audio Distribution Options In The News", DIALOG(R) File 248:PIRA, (c) 1997 Pira International, 1 pg.
"RealAudio client 3.0", DIALOG(R) File 248:PIRA, (c) 1997 Pira International, 1 pg.
"Real Progress: The Internet As Information Utility", DIALOG(R) File 248:PIRA, (c) 1997 Pira International, 1 pg.
"Digital Audio And Disabled Learners", DIALOG(R) File 2:INSPEC (c) 1997 Institution of Electrical Engineers, 1 pg.
"Emerging Technologies — New Opportunities In Platforms", DIALOG(R) File 647:CMP (c) 1997 CMP, 1 pg.

*Primary Examiner*—Mark H. Rinehart
*Attorney, Agent, or Firm*—Workman, Nydegger, Seeley

[57] ABSTRACT

A method and apparatus for compressing a continuous, indistinct data stream is disclosed. According to one aspect of the present invention, the data stream is examined to determine whether it is compressible. If compressible, the data stream is then attached to a compression stream, and compression is performed immediately to generate a compressed data stream. The compressed data stream is transmitted continuously as it is generated. According to another aspect of the invention, the data stream is an HTML data stream.

22 Claims, 10 Drawing Sheets and Apparatus
METHOD AND APPARATUS FOR COMPRESSING A CONTINUOUS, INDISTINCT DATA STREAM

CROSS-REFERENCES TO RELATED APPLICATIONS

The present application is related to the following co-pending U.S. patent applications:

U.S. patent application entitled, "Web Browser Allowing Navigation Between Hypertext Objects Using Remote Control," having application Ser. No. 08/660,088, and filed on Jun. 3, 1996; and U.S. Patent application entitled, "Method and Apparatus for Providing Proxying and Transcoding of Documents in a Distributed Network," having application Ser. No. 08/656,924, and filed on Jun. 3, 1996;

which are assigned to the assignee of the present invention.

1. Field of the Invention

The present invention relates to the field of Internet technology. Specifically, the present invention relates to a method and apparatus for compressing a continuous, indistinct data stream.

2. Description of Related Art

Personal computer use has increased substantially in recent years. With this increase, has come an explosion of use on the Internet, particularly the World Wide Web ("the Web"). The Web represents all of the computers on the Internet that offer users access to information on the Internet via interactive documents or Web pages. Although the Web has in the past been a source of primarily scientific information, it is now a valuable resource for information relating to almost any subject, including business, entertainment, travel, and education, to name just a few. As is obvious, the type of information required for each of these areas varies tremendously. For example, in the field of entertainment, the user may be attempting to access a multimedia presentation on the Web, while in the area of travel, a user may be attempting to download a scene of a particular travel location.

Given that multimedia files and graphics files take up a large amount of storage space on the Web machine, most documents on the Web, including text documents, are compressed. In general, data compression consists of transforming data into codes that are smaller than the original data. FIGS. 1A and 1B illustrate a prior art compression mechanism. This compression mechanism is based on a "block based" compression paradigm such as the Joint Pictures Experts Group (JPEG) compression algorithm. Specifically, as illustrated in FIG. 1A, data block 100 comprises block header 102, data 104, and end of block 106. In order to compress data block 100, block based compression mechanisms require knowledge of the length of the data 104. A block based compression mechanism receives information from block header 102 regarding the length of data 104, and then waits until the end of block 106 is received to indicate that data block 100 has been received completely. At that point, data block 100 is compressed and transmitted.

FIG. 1B illustrates this block based compression mechanism in further detail. As illustrated, blocks 1, 2, 3 and 4 are compressed and transmitted over a timeline. Assuming that the timeline indicates the time at which a block is retrieved, compressed and transmitted, at time t0, the retrieval of block 1 is initiated. The retrieval of block 1 continues until time t1, at which point an end of block indicator is received. Knowing that the block has been completely received, at time t1, block 1 is compressed and transmitted. There is no transmission of data in between time t0 and t1. This pattern continues with blocks 2, 3, and 4, namely there is compression and transmission of data blocks at times t2, t3 and t4, but no transmission of data in between these times while data blocks are being received.

This block based compression mechanism results in a certain amount of latency as blocks are being received and compressed prior to transmission. As described above, in between times t0, t1, t2, t3, and t4, no data blocks are transmitted. Therefore, a client machine that requests a certain amount of data may experience latency in receiving data blocks 1, 2, 3 and 4. This latency may result in a jerky picture, video or text, and the user may experience a sense of delayed response.

It is therefore desirable to have a method and apparatus for a method and apparatus for compressing a continuous, indistinct data stream, without requiring knowledge of data length prior to compression and transmission.

SUMMARY OF THE INVENTION

The present invention discloses a method and apparatus for compressing a continuous, indistinct data stream. According to one aspect of the present invention, the data stream is examined to determine whether it is compressible. If compressible, the data stream is then attached to a compression stream, and compression is performed immediately to generate a compressed data stream. The compressed data stream is transmitted continuously as it is generated. According to another aspect of the invention, the data stream is an HyperText Markup Language (HTML) data stream.

Other objects, features and advantages of the present invention will be apparent from the accompanying drawings and from the detailed description.

DESCRIPTION OF THE DRAWINGS

The present invention is illustrated by way of example and not by way of limitation in the figures of the accompanying drawings in which like reference numerals refer to similar elements and in which.

DESCRIPTION OF THE PREFERRED EMBODIMENT

The present invention relates to a method and apparatus for compressing a continuous, indistinct data stream.

"Stream compression" in the context of the present invention includes non-block based for compressing a continuous, indistinct data stream. In the following detailed description, numerous specific details are set forth in order to provide a thorough understanding of the present invention. It will be apparent to one of ordinary skill in the art, however, that these specific details need not be used to practice the present invention. In other instances, well know structures, interfaces and processes have not been shown in detail in order not to unnecessarily obscure the present invention.

Figure 1A:
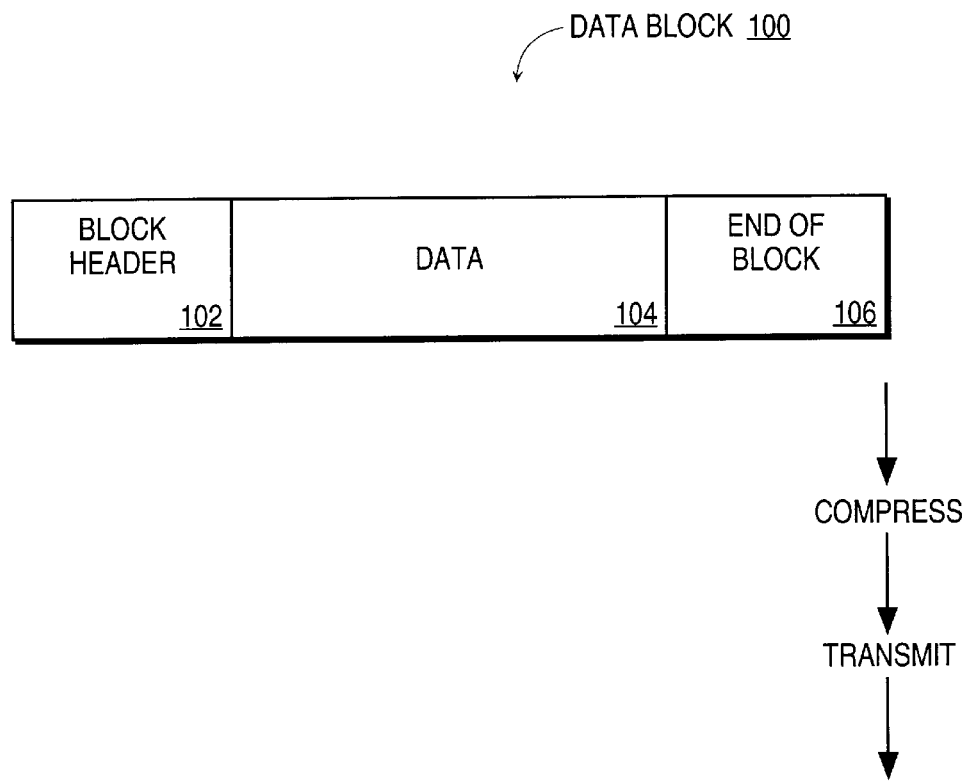
FIG. 1A illustrates a data block used in prior art compression methods.
Figure 1B:
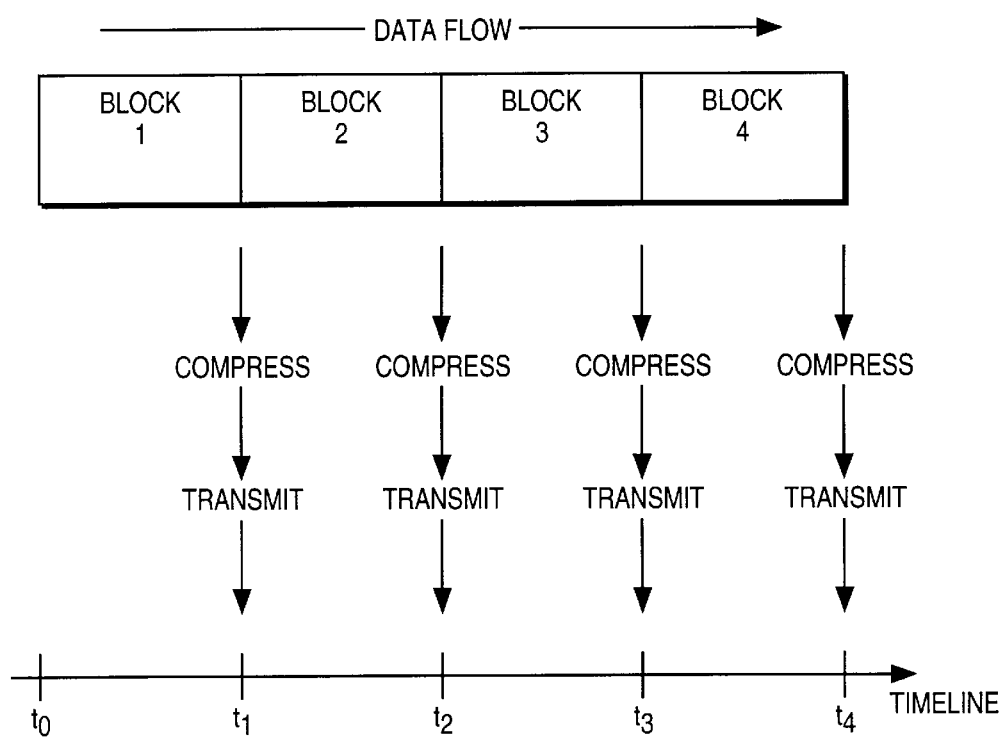
FIG. 1B illustrates how prior art compression mechanisms compress and transmit multiple data blocks.
Figure 2A:
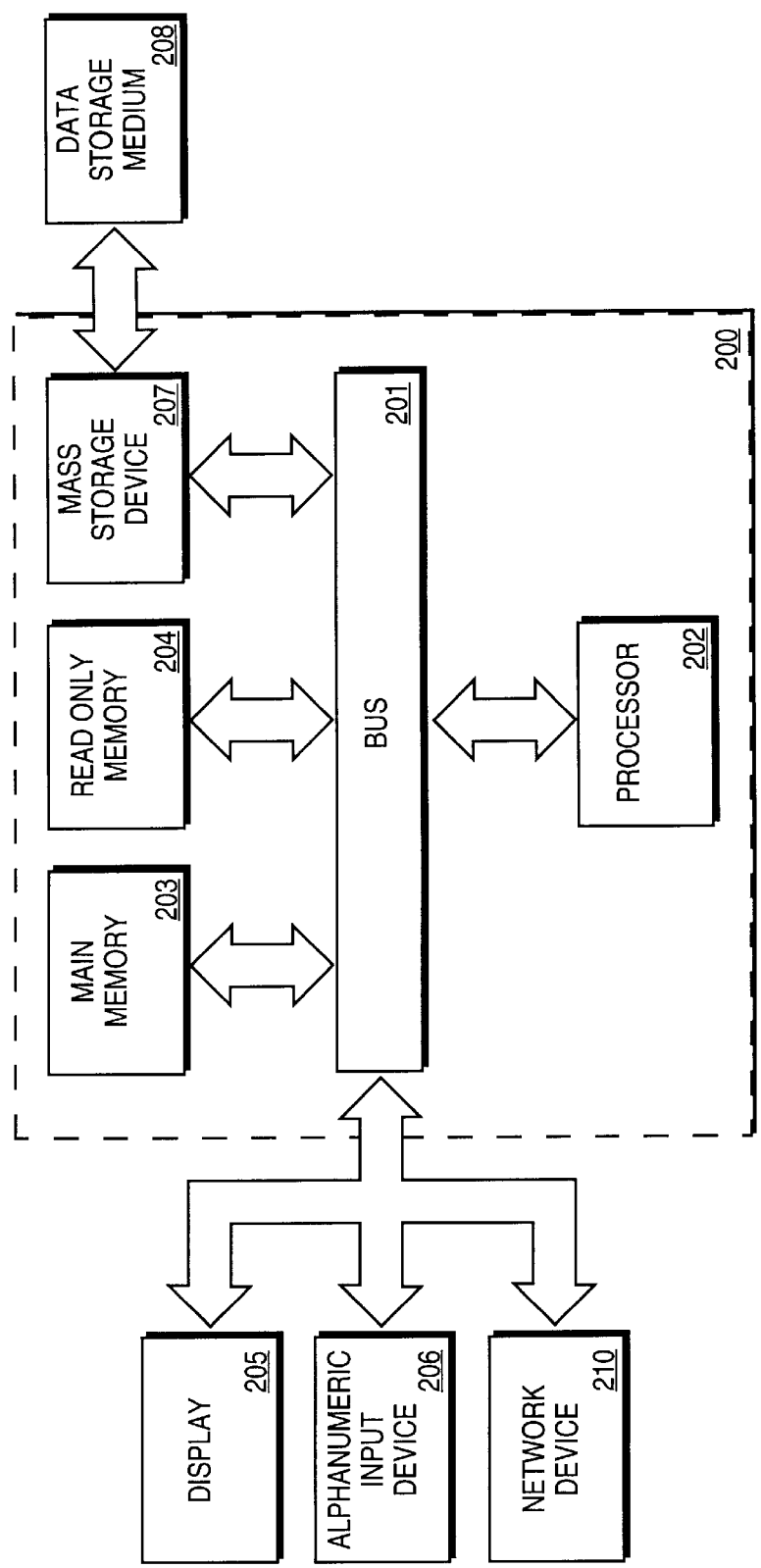
FIG. 2A is a typical computer system in which the present invention operates.

FIG. 2A illustrates a typical computer system 200 in which the present invention may operate. It will be apparent to those of ordinary skill in the art that other alternative computer system architectures may also be employed.

In general, such computer systems as illustrated by FIG. 2A comprise a bus 201 for communicating information, a processor 202 coupled with the bus 201 for processing information, main memory 203 coupled with the bus 201 for storing information and instructions for the processor 202, a read-only memory 204 coupled with the bus 201 for storing static information and instructions for the processor 202, a display device 205 coupled with the bus 201 for displaying information for a computer user, an input device 206 coupled with the bus 201 for communicating information and command selections to the processor 202, and a mass storage device 207, such as a magnetic disk and associated disk drive, coupled with the bus 201 for storing information and instructions. A data storage medium 208 containing digital information is configured to operate with mass storage device 207 to allow processor 202 access to the digital information on data storage medium 208 via bus 201.

Processor 202 may be any of a wide variety of general purpose processors or microprocessors such as the Pentium™ microprocessor manufactured by Intel™ Corporation. It will be apparent to those of ordinary skill in the art, however, that other varieties of processors may also be used in a particular computer system. Display device 205 may be a liquid crystal device, cathode ray tube (CRT), or other suitable display device. Mass storage device 207 may be a conventional hard disk drive, floppy disk drive, CD-ROM drive, or other magnetic or optical data storage device for reading and writing information stored on a hard disk, a floppy disk, a CD-ROM a magnetic tape, or other magnetic or optical data storage medium. Data storage medium 208 may be a hard disk, a floppy disk, a CD-ROM, a magnetic tape, or other magnetic or optical data storage medium.

In general, processor 202 retrieves processing instructions and data from a data storage medium 208 using mass storage device 207 and downloads this information into random access memory 203 for execution. Processor 202, then executes an instruction stream from random access memory 203 or read-only memory 204. Command selections and information input at input device 206 are used to direct the flow of instructions executed by processor 202. Equivalent input device 206 may also be a pointing device such as a conventional mouse or trackball device. The results of this processing execution are then displayed on display device 205.

Computer system 200 includes a network device 210 for connecting computer system 200 to a network. The network device 210 for connecting computer system 200 to the network includes Ethernet devices, phone jacks and satellite links. It will be apparent to one of ordinary skill in the art that other network devices may also be utilized.

The preferred embodiment of the present invention is implemented on a system known as WebTV™, by WebTV™ Networks, Inc., Palo Alto. The WebTV™ system uses a standard television set as a display device for browsing the Web and connects to a conventional network, such as the Internet, using standard telephone, Integrated Services Digital Network (ISDN), or similar communication lines. A user of a WebTV™ client system can utilize WebTV™ network services provided by one or more remote WebTV™ servers. The WebTV™ network services can be used in conjunction with software running in a WebTV™ client system to browse the Web, send electronic mail, and to make use of the Internet in various other ways. The WebTV™ network uses a HyperText Transport Protocol (HTTP) based set of protocols implemented within the Web and supported by one or more Web servers.

Figure 2B:
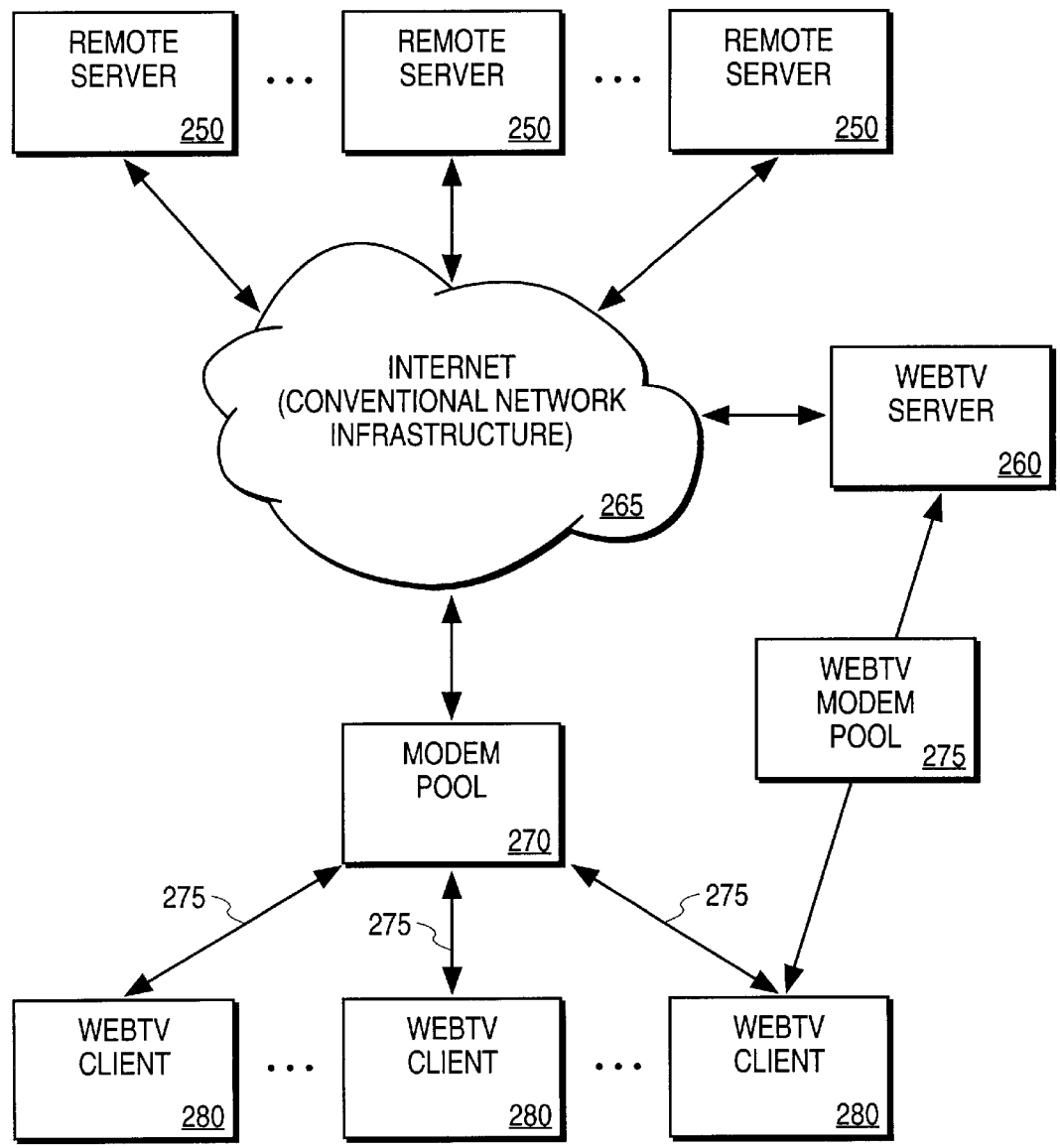
FIG. 2B is an alternate computer system (a WebTV™ system) in which the present invention operates.

FIG. 2B illustrates a basic configuration of the WebTV™ network according to one embodiment. A number of WebTV™ clients 280 are coupled to a modem pool 270 via direct-dial, bi-directional data connections 275, which may be telephone (POTS, i.e., "plain old telephone service"), ISDN (Integrated Services Digital Network), or any other similar type of connection. Modem pool 270 is coupled typically through a router, such as that conventionally known in the art, to a number of remote servers 250 via a conventional network infrastructure 265, such as the Internet.

The WebTV™ system also includes a WebTV™ server 260, which specifically supports the WebTV™ clients 280. WebTV™ server 260 acts as a proxy in providing the WebTV™ client 280 with access to the Web and other WebTV™ services. More specifically, WebTV™ server 260 functions as a "caching proxy." A proxy cache on WebTV™ server 260 is used for temporary storage of Web documents, images, and other information which is used by frequently either the WebTV™ client 280 or the WebTV™ server 260.

A document transcoder is also provided as part of WebTV™ server 260. The document transcoder includes software which is used to automatically 10 revise the code of Web documents retrieved from remote servers 250. Transcoding is performed in one of the following modes: (1) streaming, (2) buffered, and (3) deferred. Further details of the proxy and transcoding mechanism are described in co-pending U.S. Patent application entitled, "Method and Apparatus for Providing Proxying and Transcoding of Documents in a Distributed Network," having application Ser. No. 08/656,924, and filed on Jun. 3, 1996. Currently available commercial proxy servers may be modified to include the transcoding functionality described in the co-pending application.

WebTV™ clients 280 each have a connection to the WebTV™ server 260 either directly, via a WebTV™ modem pool 275, similar to modem pool 270, or through the conventional modem pool 270 and the Internet 265. Note that the modem pool 270 is a conventional modem pool, such as those found today throughout the world providing access to the Internet and private networks. Further details of the WebTV™ system, including the WebTV™ client can be found in co-pending U.S. patent application entitled, "Web Browser Allowing Navigation Between Hypertext Objects Using Remote Control," having application Ser. No. 08/660,088, and filed on Jun. 3, 1996.

One embodiment of the present invention is implemented as a software module, which may be executed on a computer system such as computer system 200 or WebTV™ server 260 in a conventional manner. Using well known techniques, the application software of the preferred embodiment is stored on data storage medium 208 and subsequently loaded into and executed within computer system 200 or WebTV™ server 260. Once initiated, the software of this embodiment operates in the manner described below.

Figure 3:
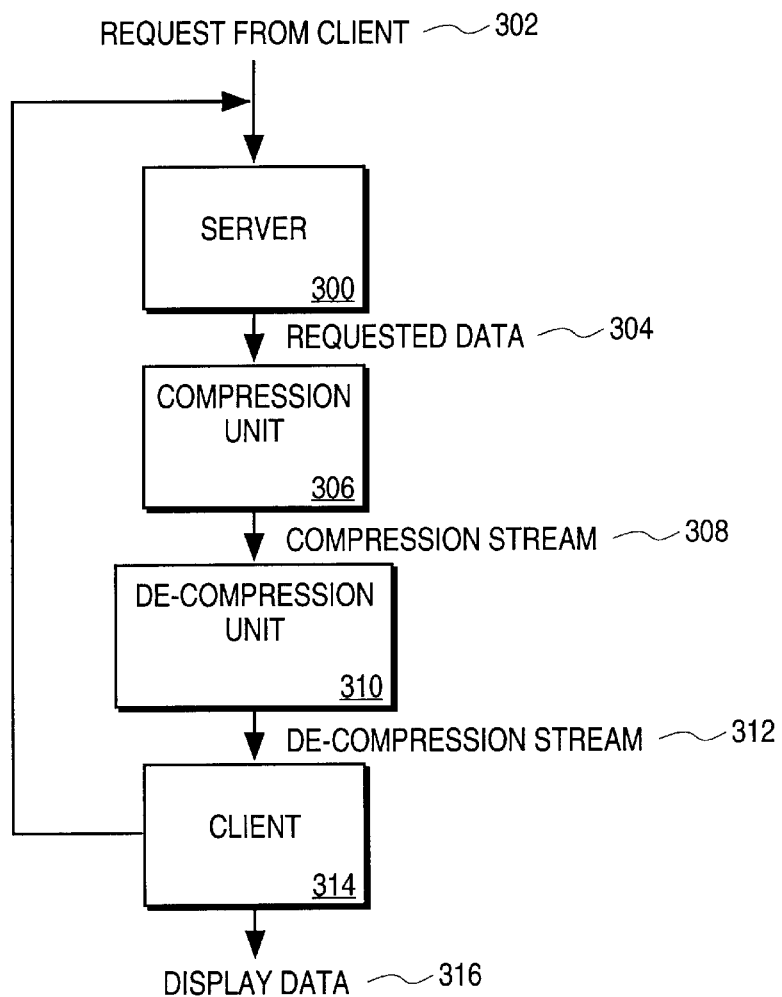
FIG. 3 illustrates an overview of one embodiment of the presently claimed invention.

FIG. 3 illustrates an overview of one embodiment of the present invention. Specifically, request 302 is received from a client at server 300. Server 300 transmits requested data 304 to a compression unit 306. Compression unit 306 may reside on server 300 or on a separate system. Compression unit 306 attaches requested data 304 to compression stream 308 which is then received on the receiving end by a decompression unit 310. Decompression unit 310 may be a part of client 314 or a separate system. Decompression unit 310 receives the compressed requested data 304 and attaches the compressed requested data 304 to decompression stream 312. The decompressed display data 316 is then displayed by client 314.

Figure 4A:
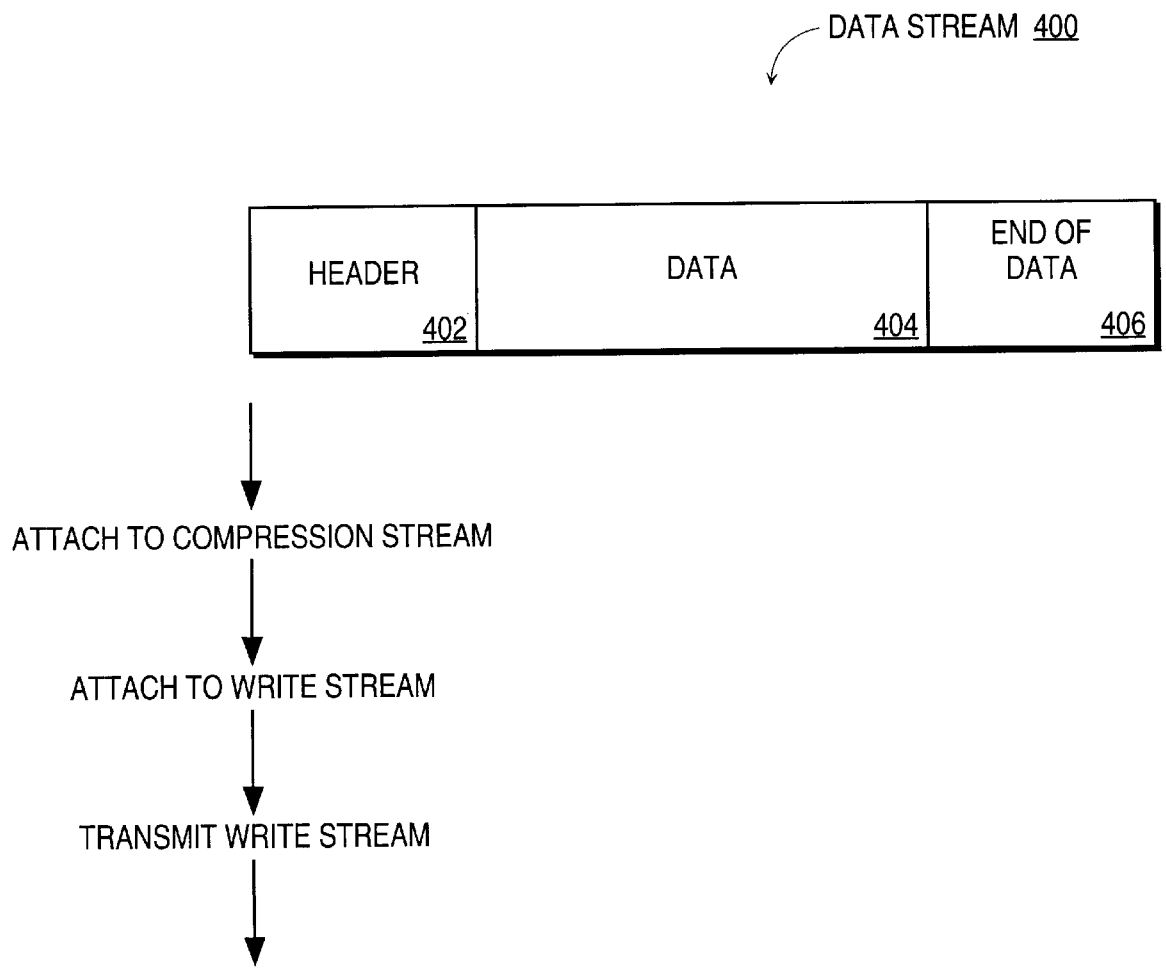
FIG. 4A illustrates a data stream according to one embodiment of the present invention.
Figure 4B:
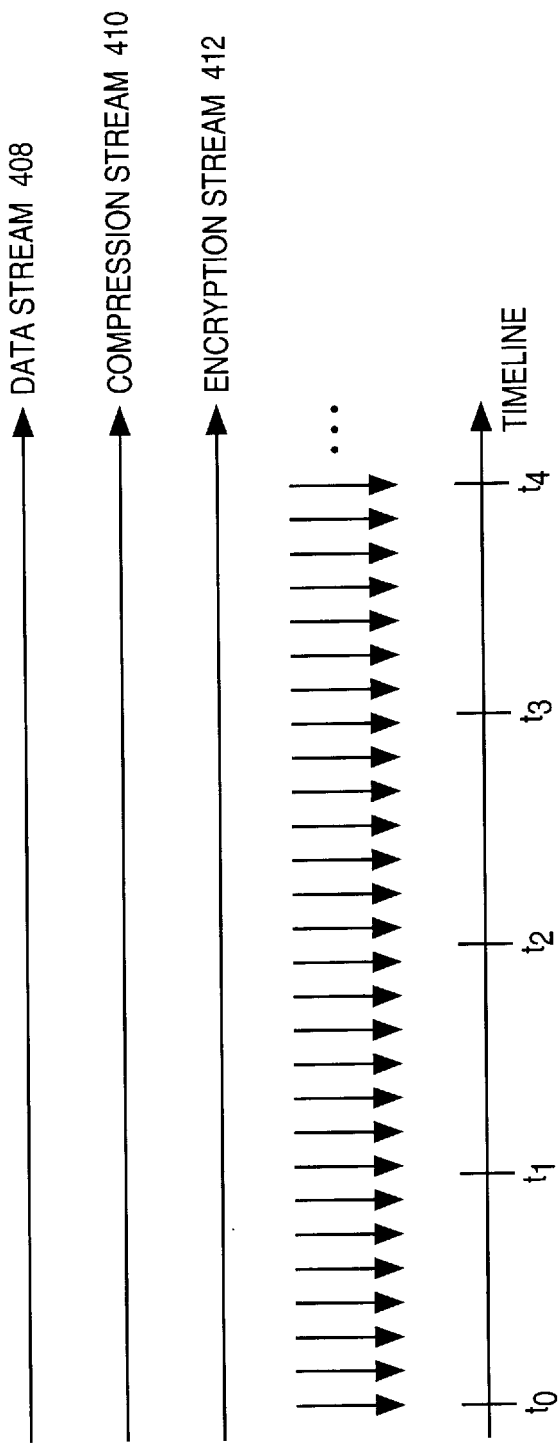
FIG. 4B illustrates the compression and transmission of data packets according to a time line.
Figure 4C:
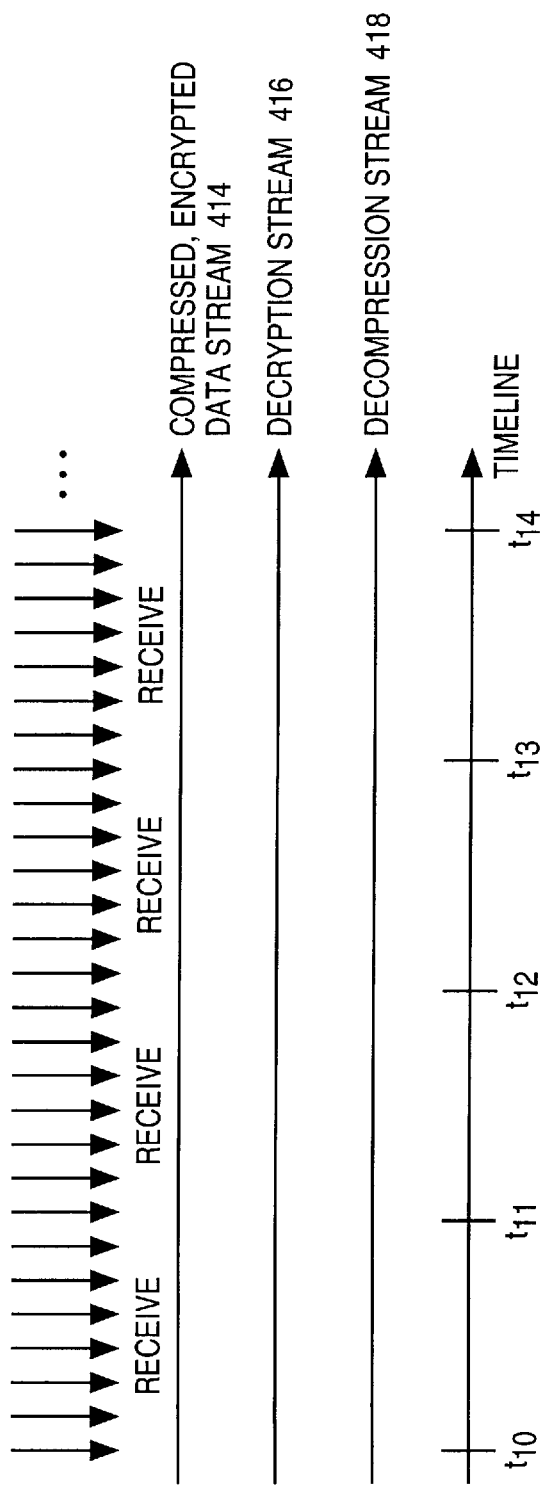
FIG. 4C illustrates the receipt of compressed encrypted data packets based on a timeline.

FIGS. 4A–4C illustrate one embodiment of the present invention in further detail. Specifically, according to this embodiment, a stream compression or on "on the fly" compression paradigm is utilized instead of a block paradigm. "On the fly" in the context of the present invention includes the fact that the stream compression process according to the present invention does not wait for a predetermined amount of data prior to compression. Instead, stream compression according to the present invention attaches the data stream to a compression stream and begins to compress and transmit the data immediately when the process determines that the data is compressible. The stream compression process continuously compresses and transmits data attached to a compression stream until all the requested data has been transmitted. One embodiment of the present invention utilizes a modified version of adaptive Huffman coding to perform the stream compression. Adaptive Huffman coding techniques are well known to one of ordinary skill in the art. Other coding algorithms such as the LZP algorithm may also be utilized.

As illustrated in FIG. 4A, data stream 400 includes a header 402, data 404 and end of data indicator 406. In the context of the Web, header 402 is a content type header. A content type header is defined as part of the HTTP communications protocol for communication between Web client machines and Web servers. Other types of headers are used for other communications protocols. Headers generally provide information regarding the type and characteristics of the data following the header.

Data packet 400 is examined prior to compression, and header 402 is used to determine whether data 404 can be compressed. According to one embodiment of the present invention, data 404 is HTML data, as indicated by content type header "text/HTML." When the compression unit detects data packet 400 with a content header that indicates that data 404 is compressible, data 404 is immediately attached to a compression stream that transmits the compressed data. Note that other predetermined functions may be performed on data packet 400 prior to compression. These predetermined functions include counting the bytes in the data stream and printing the bytes in the data stream.

According to another embodiment of the present invention, data stream 400 does not include a header 402. In this embodiment, the file extension of the retrieved data may be examined to determine what type of data may be found in that file. For example, even if the file is an HTML file without a content type header "text/HTML," the type of data in the file may still be determined by examining the file extension. In this example, if the file extension is .HTML, the type of data in the file is determined to be HTML data, and the data in the file is marked as compressible. Other file extensions include AVI for a Microsoft digital video file, for example. Once the content of the file is determined, then data 404 is attached to a compression stream that transmits the compressed data, as described above.

This embodiment of the present invention attaches the data to the compression stream without knowing the length of the data to be compressed and without waiting for a predetermined amount of data to be received. The steps of compression, attachment and transmission occur continuously until all the requested data is compressed and transmitted. As described above, in the block based compression paradigm, the compression unit waits until it receives an end of block indicator before beginning to compress the data.

FIGS. 4B and 4C illustrate this embodiment in further detail. FIG. 4B illustrates a data stream 408 attached to compression stream 410. Data stream 408 may also be attached to any other type of appropriate stream such as encryption stream 412. This "layering" of function streams allows the functions to be performed almost simultaneously, without waiting for all the data to be received. WebTV™ servers can perform this type of stream compression without any further modification. Other standard Web servers may be modified to provide the same functionality.

As illustrated in FIG. 4B, compression and transmission occur continuously, and not simply at times t1, t2, t3 and t4. Data begins compressing and transmitting at time t0, as soon as the compression unit determines that the data is compressible. Data continues to be compressed and transmitted between times t0, t1, t2, t3 and t4. In this way, the present invention overcomes the defect inherent in the block based compression paradigm, where the compression mechanism is required to wait for specific lengths of data prior to compression, thus causing an inherent latency in the data transmission.

FIG. 4C illustrates the receiving end of the compressed data. A compressed encrypted data stream 414 is received and is attached to decryption stream 416 and decompression stream 418. As illustrated, the data is received continuously and attached to decryption stream 416 and decompression stream 418. Therefore, instead of data being received, decrypted and decompressed only at times t11, t12, t13 and t14, data is received, decrypted and decompressed in between all of these times as well. WebTV™ clients can perform this type of stream decompression without any further modification. Other standard Web browsers may be modified to provide the same functionality. Alternatively, additional software components or "plug-ins" may be provided to enhance a standard Web browser to provide the same functionality.

Figure 5:
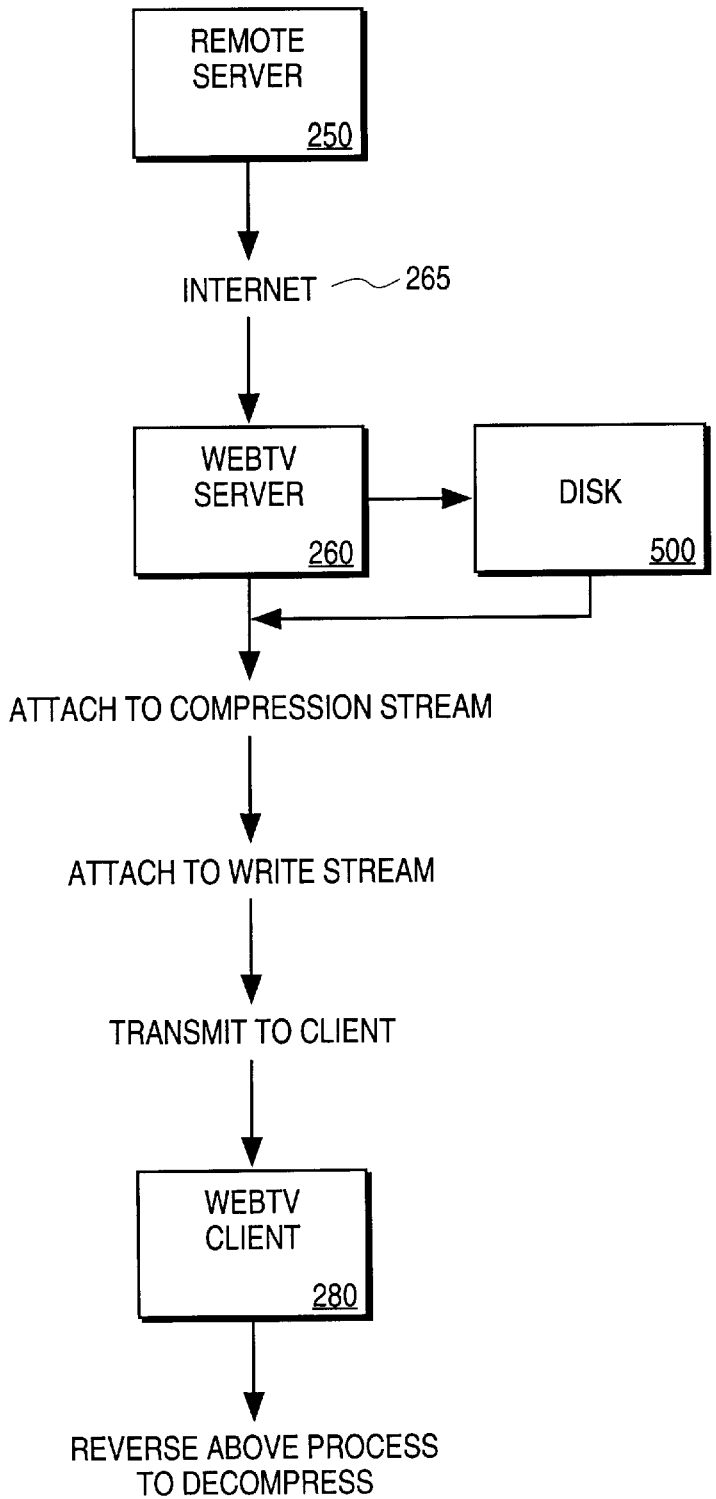
FIG. 5 illustrates one embodiment of the present invention implemented in a WebTV™ system.

Fig. 5 illustrates one embodiment of the present invention as implemented in a WebTV™ m system. WebTV™ client 280 makes a request. The request is processed and data is returned from remote server 250. Data from remote server 250 is transmitted via the Internet 265 to WebTV™ server 260. WebTV™ server 260 may write the data to disk 600 as well as transmit the data to WebTV™ client 280 simultaneously. Prior to transmission, the content type header of the data is examined. If the data is determined to be compressible, the data is attached to a compression stream. If the data does not include a content type header, then the file extension is examined to determine the type of data in the file. According to this embodiment of the invention, the data is determined to be compressible if the content type header or the file extension of the data indicates HTML data.

The compression stream is then attached to a write stream and the data is transmitted to WebTV™ client 280.

Figure 6:
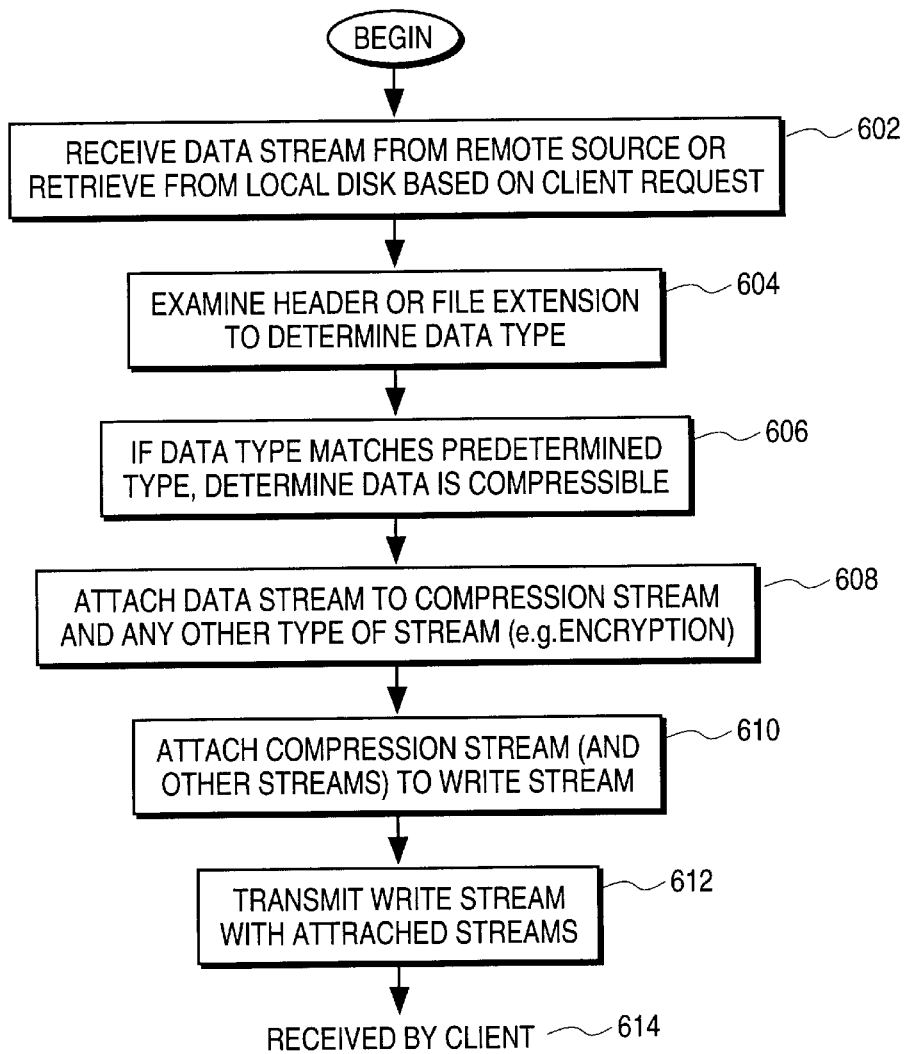
FIG. 6 is a flow chart illustrating one embodiment of the present invention.

FIG. 6 is a flowchart that illustrates one embodiment of the present invention. Based on a client request, a data stream is received from a remote source or retrieved from a local disk in step 602. In step 604, the header of the data or the file extension is examined to determine the data type. If the data type matches a predetermined type, in step 606 the data is determined to be compressible. The data stream is attached to a compression stream or any other type of steam such as an encryption stream in step 608. The compression stream and other streams are then attached to a write stream in step 610. In step 612, write stream is transmitted with the attached streams, and in step 614 the write stream is received by the client.

Thus, a method and apparatus for stream compression is disclosed. The specific arrangements and methods described herein are merely illustrative of the principles of the present invention. Numerous modifications in form and detail may be made by those of ordinary skill in the art without departing from the scope of the present invention. Although this invention has been shown in relation to a particular preferred embodiment, it should not be considered so limited. Rather, the present invention is limited only by the scope of the appended claims.

We claim:

1. In a networked computer system comprising a plurality of logically interconnected network servers and client systems, and wherein at least some of said network servers are comprised of a compression unit and at least some of said client systems are comprised of a data decompression unit, a method of transmitting and receiving a continuous, indistinct data stream so as to reduce latency between the time data is retrieved and the time the data is transmitted by a network server, the method comprising the steps of:

in response to a request from a client system, retrieving at a network server data to be transmitted back to the client system;

as soon as data retrieval is initiated and without regard to retrieving a complete block of data, determining whether the retrieved data is compressible;

without regard to retrieving a complete block of data, attaching the retrieved data to a compression stream generated at the compression unit and essentially simultaneously transmitting the data as it is retrieved and attached to the compression stream, and continuing to retrieve the requested data, attach it to the compression stream and transmit the attached data without regard to any predetermined length of the data until all requested data has been sent; and receiving the transmitted data as attached to the compression stream in the form of a continuous, indistinct data stream at a decompression unit of a client server, and detaching and decompressing the data as it is received without regard to any predetermined length of the data.

2. The method according to claim 1 wherein said step of determining whether said retrieved data is compressible includes the step of examining said retrieved data to determine whether a header of said retrieved data matches a predetermined header type.

3. The method according to claim 1 wherein said step of determining whether said retrieved data is compressible includes the step of examining said retrieved data to determine whether a file extension of a file from which said retrieved data originated matches a predetermined file extension type.

4. The method according to claim 1 wherein said step of attaching the retrieved data to the compression stream includes the step of performing predetermined functions on said retrieved data.

5. The method according to claim 4 wherein said step of performing predetermined functions on said retrieved data includes the step of performing a count of data bytes in said retrieved data.

6. The method according to claim 4 wherein said step of performing predetermined functions on said retrieved data includes the step of performing a print of data bytes in said retrieved data, whereby said data bytes are moved to said compression stream.

7. The method according to claim 1 wherein said retrieved data is an HTML data stream.

8. In a networked computer system comprising a plurality of logically interconnected network servers and client systems, and wherein at least some of said network servers are comprised of a compression unit and at least some of said client systems are comprised of a data decompression unit, a method of transmitting and receiving a continuous, indistinct data stream so as to reduce latency between the time data is retrieved and the time the data is transmitted by a network server, the method comprising the steps of:

in response to a request from a client system, retrieving at a network server data to be transmitted back to the client system;

as soon as data retrieval is initiated and without regard to retrieving a complete block of data, determining whether the retrieved data is compressible by performing one of the steps of:

examining said retrieved data to determine whether a header of said retrieved data matches a predetermined header type; and examining said retrieved data to determine whether a file extension of a file from which said retrieved data originated matches a predetermined file extension type;

without regard to retrieving a complete block of data, attaching the retrieved data to a compression stream generated at the compression unit and essentially simultaneously transmitting the data as it is retrieved and attached to the compression stream, and continuing to retrieve the requested data, attach it to the compression stream and transmit the attached data without regard to any predetermined length of the data until all requested data has been sent; and receiving the transmitted data as attached to the compression stream in the form of a continuous, indistinct data stream at a decompression unit of a client server, and detaching and decompressing the data as it is received without regard to any predetermined length of the data.

9. The method according to claim 8 further comprising the step of executing predetermined functions on said retrieved data prior to attaching said retrieved data to said compression stream.

10. The method according to claim 8 further comprising the step of executing a count of data bytes in said retrieved data prior to attaching said retrieved data to said compression stream.

11. The method according to claim 8 further comprising the step of executing a print of data bytes in said retrieved data whereby said data bytes are moved to said compression stream.

12. In a networked computer system comprising a plurality of logically interconnected network servers and client systems, and wherein at least some of said network servers are comprised of a compression unit and at least some of said client systems are comprised of a data decompression unit, a computer program product for implementing a method of transmitting a continuous, indistinct data stream so as to reduce latency between the time data is retrieved and the time the data is transmitted by a network server, the computer program product comprising:

a computer readable medium for carrying computer program code means for implementing said method; and said computer program code means comprising:

program code means for retrieving at a network server data to be transmitted back to a client system in response to a request from the client system;

program code means for determining whether the retrieved data is compressible as soon as data retrieval is initiated and without regard to retrieving a complete block of data; and program code means for attaching the retrieved data to a compression stream generated at the compression unit without regard to retrieving a complete block of data, and essentially simultaneously transmitting the data as it is retrieved and attached to the compression stream, and continuing to retrieve the requested data, attach it to the compression stream and transmit the attached data without regard to any predetermined length of the data until all requested data has been sent.

13. The computer program product according to claim 12 wherein said program code mean for determining whether said retrieved data is compressible comprises program code means for examining said retrieved data to determine whether a header of said retrieved data matches a predetermined header type.

14. The computer program product according to claim 12 wherein said program code means for determining whether said retrieved data is compressible comprises program code means for examining said retrieved data to determine whether a file extension of a file from which said retrieved data originated matches a predetermined file extension type.

15. The computer program product according to claim 12 wherein said program code means for attaching the retrieved data to a compression stream comprises program code means for performing predetermined functions on said data stream.

16. The computer program product according to claim 15 wherein performing said predetermined functions on said retrieved data includes performing a count of data bytes in said retrieved data.

17. The computer program product according to claim 15 wherein performing said predetermined functions on said retrieved data includes performing a print of data bytes in said retrieved data whereby said data bytes are moved to said compression stream.

18. The computer program product according to claim 12 wherein said retrieved data is an HTML, data stream.

19. In a networked computer system comprising a plurality of logically interconnected network servers and client systems, and wherein at least some of said network servers are comprised of a compression unit and at least some of said client systems are comprised of a data decompression unit, a computer program product for implementing a method of transmitting a continuous, indistinct data stream so as to reduce latency between the time data is retrieved and the time the data is transmitted by a network server, the computer program product comprising:

a computer readable medium for carrying computer program code means for implementing said method; and said computer program code means comprising:

program code means for retrieving at a network server data to be transmitted back to a client system in response to a request from the client system;

program code means for determining whether the retrieved data is compressible as soon as data retrieval is initiated and without regard to retrieving a complete block of data by performing one of the steps of:

examining said retrieved data to determine whether a header of said retrieved data matches a predetermined header type; and examining said retrieved data to determine whether a file extension of a file from which said retrieved data originated matches a predetermined file extension type; and program code means for attaching the retrieved data to a compression stream generated at the compression unit without regard to retrieving a complete block of data, and essentially simultaneously transmitting the data as it is retrieved and attached to the compression stream, and continuing to retrieve the requested data, attach it to the compression stream and transmit the attached data without regard to any predetermined length of the data until all requested data has been sent.

20. The computer program product according to claim 19 wherein said program code means for attaching the retrieved data to a compression stream comprises program code means for performing predetermined functions on said retrieved data prior to said retrieved data being attached to said compression stream.

21. The computer program product according to claim 20 wherein performing said predetermined functions includes executing a count of data bytes in said retrieved data.

22. The computer program product according to claim 20 wherein performing said predetermined functions includes executing a print of data bytes in said retrieved data, whereby said data bytes are moved to said compression stream.

\* \* \* \* \*

UNITED STATES PATENT AND TRADEMARK OFFICE
CERTIFICATE OF CORRECTION

PATENT NO. : 5,838,927
DATED : November 17, 1998
INVENTOR(S) : William G. Gillon, Andrew McFadden It is certified that error appears in the above-identified patent and that said Letters Patent is hereby corrected as shown below:

Col. 3, ln. 8: after "well" change "know" to --known--

Col. 4, ln. 37: after "automatically" delete [10]

Col. 6, ln. 3: after "include" change "AVI" to --.AVI--

Col. 6, ln. 54: after "WebTV$^{Tm}$" delete [m]

Col. 9, ln. 29: after "code" change "mean" to --means--

Col. 9, ln. 55: after "HTML" and before "data" delete [,]